United States Patent [19]

Fitzpatrick et al.

[11] Patent Number: 4,868,416

[45] Date of Patent: Sep. 19, 1989

[54] FET CONSTANT REFERENCE VOLTAGE GENERATOR

[75] Inventors: Mark E. Fitzpatrick, San Jose; Gary R. Gouldsberry, Cupertino, both of Calif.

[73] Assignee: Gazelle Microcircuits, Inc., Santa Clara, Calif.

[21] Appl. No.: 133,115

[22] Filed: Dec. 15, 1987

[51] Int. Cl.[4] .......................... H03K 3/01; G05F 3/04; G05F 3/16

[52] U.S. Cl. ................................. 307/296.8; 307/304; 323/311; 323/313

[58] Field of Search ................ 307/296.8, 297, 296 R, 307/296.6, 296.7, 304; 323/311-315, 316-317, 349-350

[56] References Cited

U.S. PATENT DOCUMENTS

| | | | |
|---|---|---|---|
| 3,806,742 | 4/1974 | Powell | 323/313 |
| 4,020,367 | 4/1977 | Yamashiro et al. | 307/297 |
| 4,453,121 | 6/1984 | Noufer | 323/313 |
| 4,645,998 | 2/1987 | Shinohara et al. | 307/304 |
| 4,675,592 | 6/1987 | Tsuzuki | 323/313 |
| 4,686,451 | 8/1987 | Li et al. | 323/313 |
| 4,692,689 | 9/1987 | Takemae | 323/313 |
| 4,725,770 | 2/1988 | Okutsa et al. | 323/313 |

FOREIGN PATENT DOCUMENTS

| | | | |
|---|---|---|---|
| 0220789 | 1/1986 | European Pat. Off. | |
| 3515006 | 10/1985 | Fed. Rep. of Germany | 323/313 |
| WO82/04143 | 4/1981 | PCT Int'l Appl. | |
| WO86/02180 | 4/1986 | PCT Int'l Appl. | |
| 2047924A | 4/1980 | United Kingdom | |

*Primary Examiner*—Stanley D. Miller
*Assistant Examiner*—Timothy P. Callahan
*Attorney, Agent, or Firm*—Skjerven, Morrill, MacPherson, Franklin & Friel

[57] ABSTRACT

The present invention includes circuitry wherein a pair of voltage supply terminals are included, with a first current source connected to one voltage supply terminal and a second current source connected to the other voltage supply terminal. A load connects the first and second currect sources. A field effect transistor has a first current handling terminal connected between the first current source and load, a second current handling terminal connected to the other voltage supply terminal, and a current control terminal connected between the load and the second current source. The second current source is of the type wherein the current thereacross is substantially independent of changes in voltage thereacross.

10 Claims, 7 Drawing Sheets

FET CONSTANT REFERENCE VOLTAGE GENERATOR

BACKGROUND OF THE INVENTION

This invention relates to electronic circuitry capable of generating a substantially constant reference voltage, and more particularly, to such circuitry which may be implemented in gallium arsenide technology.

DESCRIPTION OF THE PRIOR ART

A typical circuit for implementation in semiconductor technology may require a plurality of different reference voltages to be applied at appropriate places for proper operation thereof. As an example, the input buffer circuit shown in FIG. 1A may require a reference voltage $V_{REF1}$ applied to the gates of transistors 20, 21, respectively, so as to provide a substantially constant voltage swing across the resistors $R_{L1}$, $RL_{L2}$ during operation of the differential pair of transistors 22, 24 and the differential pair of transistors 26, 28. Furthermore, a reference voltage $V_{REF2}$ may be needed which should have the capability of insuring that a constant current is provided through each of the respective resistors $R_C$, operatively associated with the differential pair of transistors 26, 28. Additionally, a reference voltage $V_{REF3}$ is useful in the situation where the transistors 22, 24 make up a differential pair of transistors of the "single ended" input type, i.e., the input to the gate of transistor 22 is varied above and below the input signal $V_{REF3}$. Also, in certain situations, such as the situation of reference voltage $V_{REF4}$, this reference voltage should with advantage be capable of sinking a large and varying current, due to the fact that it may be operatively coupled with a large number of differential pair transistors (only one of which is shown at 22, 24), to limit the voltage on node 30 from going too high.

Heretofore, attempts have been made to provide circuits which generate such reference voltages and currents, in order to meet the needs described. Such circuits have limitations in achieving these goals, and in fact the difficulty in achieving such goals is increased when there is an attempt to implement the circuits in gallium arsenide technology.

SUMMARY

It is accordingly an object of this invention to overcome the problems cited above by providing circuitry capable of generating various reference voltages and currents as described above in a highly efficient manner, regardless of the technology in which these circuits are implemented, and further providing that such circuits can effectively be implemented in gallium arsenide technology.

Broadly stated, the invention is in a semiconductor device implemented in gallium arsenide technology, and comprises circuit means for generating a substantially constant reference voltage upon application of a power supply thereto.

This invention is further in a semiconductor device implemented in gallium arsenide technology, and comprises circuit means for generating a substantially constant current upon application of a voltage thereto.

The invention is further in apparatus for generating a reference voltage, and comprises a first voltage supply terminal and a second voltage supply terminal. First and second field effect transistors are connected in series between the first and second voltage supply terminals, and means are operatively associated with the first transistor for generating a voltage substantially equal to the pinch-off voltage of the first transistor. Means are further operatively associated with the second transistor for generating a voltage substantially equal to the threshold voltage of the second transistor. The reference voltage is taken at a node between the first and second voltage supply terminals.

The invention is further in apparatus for generating a voltage comprising a first voltage supply terminal and a second voltage supply terminal. A depletion mode field effect transistor has first and second current handling terminals and a current control terminal, the first current handling terminal connected to the first voltage supply terminal. A resistor is connected to the second current handling terminal of the depletion mode field effect transistor and the second voltage supply terminal. The current control terminal of the depletion mode field effect transistor is connected to the second voltage supply terminal, whereby the voltage across the resistor is substantially equal to the pinch-off voltage of the depletion mode field effect transistor.

The invention further comprises a second resistor connecting the first-mentioned resistor to the second voltage supply terminal, the current control terminal of the depletion mode field effect transistor being connected to the second voltage supply terminal through the second resistor. The invention further comprises a second, enhancement mode field effect transistor having first and second current handling terminals and a current control terminal. The second resistor is connected to the first current handling terminal of the second transistor, the second current handling terminal of the second transistor being connected to the second voltage supply terminal, whereby the second resistor is connected to the second voltage supply terminal through the second transistor. The current control terminal of the first-mentioned, depletion mode field effect transistor is connected between the first and second resistors, a third resistor connecting the first current handling terminal and current control terminal of the second transistor. A fourth resistor connects the current control terminal of the second transistor at the second voltage supply terminal, the reference voltage being taken at a node between the first and second resistors.

Broadly stated, the invention is further in a variable resistor structure having first and second terminals, and comprising a first resistor connected to the first terminal, a second resistor connected to the first resistor and the second terminal, a first disconnectable link connecting one end of the first resistor with the other end of the first resistor, and a second disconnectable link connecting one end of the second resistor with the second terminal.

Broadly stated, the invention is further in apparatus for generating a substantially constant reference voltage while sinking varying current comprising a first voltage supply terminal and a second voltage supply terminal. A first current source is connected to the first voltage supply terminal. A load is connected to the first current source A second current source is connected to the load and to the second voltage supply terminal. A field effect transistor has a first current handling terminal connected between the first current source and the load, a second current handling terminal connected to the second voltage supply terminal, and a current control terminal connected between the load and second current source.

BRIEF DESCRIPTION OF THE DRAWINGS

Other objects of the invention will become apparent from a study of the following specification and drawings, in which.

DETAILED DESCRIPTION

Figure 1:
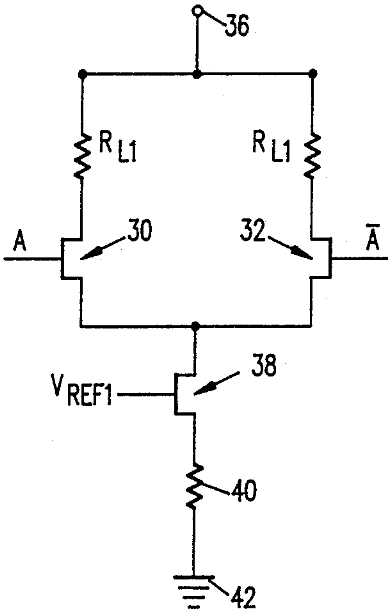
FIG. 1 is a schematic view of a differential pair of transistors to which a present circuit can with advantage be applied.

Shown in FIG. 1 is a typical differential pair of transistors 30, 32. In this embodiment, the transistors are enhancement mode junction field effect transistors, each having its drain connected to a voltage supply terminal 36 through a respective resistor $R_{L1}$, and having the sources thereof connected together. These sources are further connected to the drain of another enhancement mode junction field effect transistor 38, which has its source connected through a resistor 40 to a second voltage supply terminal 42, which is a ground voltage supply terminal. Inverse signals A and $\overline{A}$ are applied to the gates of the respective transistors 30, 32 as is well known.

In the operation of such a circuit, it is recognized that a substantially constant voltage swing across each resistor $R_{L1}$ is desired. However, it is further known that the resistance value of these resistors $R_{L1}$ varies with temperature, and also with variations in process in manufacturing the device.

A substantially constant voltage swing across each resistor $R_{L1}$ can be achieved by providing that the voltage across the resistor 40 remains substantially constant over process and temperature variations. In turn, it would be possible to achieve this feature through proper generation of the voltage $V_{REF1}$ applied to the gate of transistor 38.

It has been found that for a given field effect transistor process the difference in threshold voltage between transistors of two different threshold types has been found to be substantially constant. That is, for example, in a specific embodiment wherein the two transistors are made up of one enhancement and one depletion mode transistor, $V_t - V_p$=constant.

Further circuitry herein is directed toward providing a voltage across the resistor 40 that is $K(V_t - V_p)$ where K is a constant. It will be seen that if this is achieved, the voltage across the resistor 40 will remain substantially constant, independent of temperature variations and variations in the fabrication process of the device.

Figure 2:
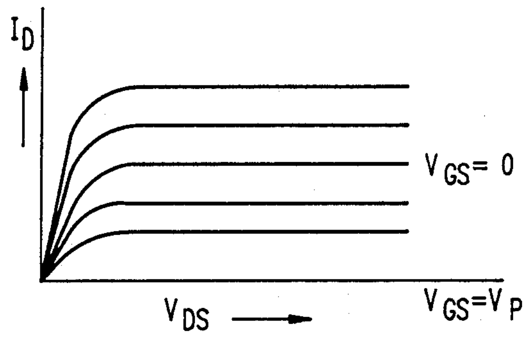
FIG. 2 is a voltage-versus-current graph for a typical field effect transistor.
Figure 3:
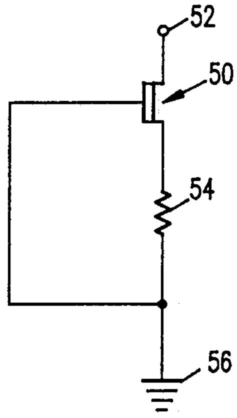
FIG. 3 is a schematic view of a circuit for generating a voltage substantially equal to the pinch-off voltage of a field effect transistor.

Referring next to FIGS. 2 and 3, shown in FIG. 3 is a depletion mode junction field effect transistor 50 having its drain connected to a voltage supply terminal 52, and its source connected to a resistor 54 which is in turn connected to a second voltage supply terminal 56 in the form of a ground terminal. The gate of the transistor 50 is also connected to the second voltage supply terminal 56. The graph of FIG. 2 illustrates behavior of such a typical transistor upon application of voltage $V_{DS}$ across the drain and source thereof versus current $I_D$ through the device, as voltage $V_{GS}$ (voltage across the gate and source) changes. As shown therein, decreasing $V_{GS}$ decreases the maximum current allowed through the device until the voltage across the gate to source equals $V_P$, which is the pinch-off voltage of the device. Assuming the value of the resistor 54 is relatively high, upon external voltage being supplied to terminal 52, the voltage drop across the resistor 54 ($V_{R54} = I_{DS} \times R_{54}$) will quickly exceed $-V_P$ which would tend to turn off the transistor 50. However, if the transistor 50 is off, $V_S = V_G$ so that $V_{GS} = 0$, meaning that the transistor 50 is on. The net effect is that the source of the transistor 50 equilibrates at approximately $-V_P$ above the gate voltage. Thus, the voltage across the resistor 54 is substantially $-V_P$, independent of the value of the resistor 54.

Figure 4:
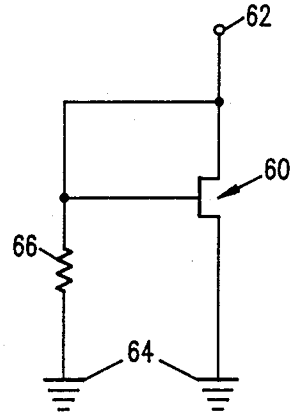
FIG. 4 is a schematic view of a circuit for generating a voltage substantially equal to the threshold voltage of a field effect transistor.
Figure 1A:
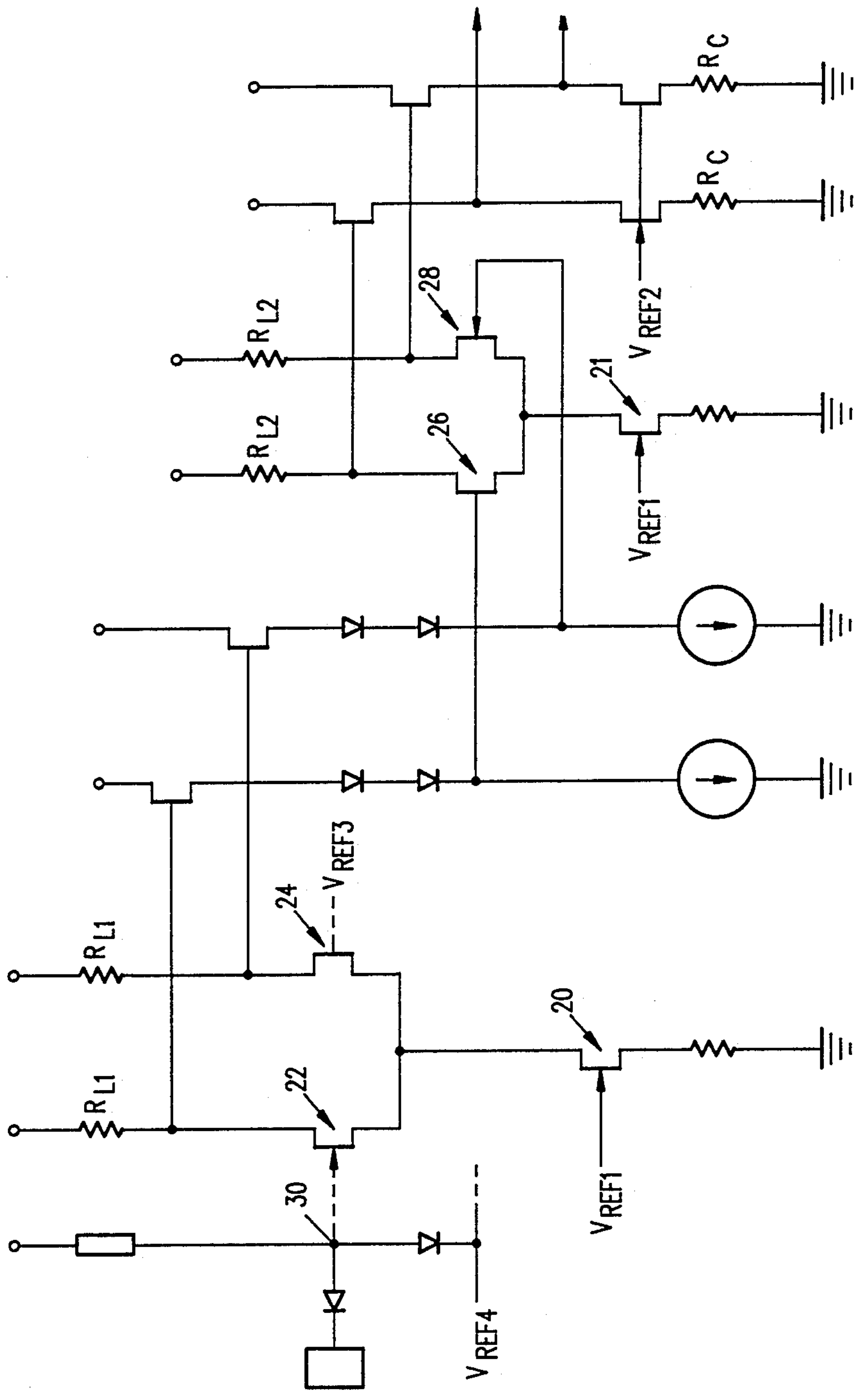
FIG. 1A is a schematic view of an input buffer circuit for application of reference voltage thereto.

Referring to FIG. 4, shown at 60 is an enhancement mode junction field effect transistor having its drain connected to a voltage supply terminal 62, and its source connected to a second voltage supply terminal 64 in the form of a ground terminal. The transistor 60 has its gate connected to its drain, and also has its gate connected to a resistor 66, in turn connected to the second voltage supply terminal. Assuming an external voltage supplied to the terminal 62 and a current flowing through the transistor 60 from the voltage supply terminal 62 to the voltage supply terminal 64, with the transistor 60 off, all current would flow through the resistor 66. However, if the resistor 66 value is chosen so that the product of the current and the resistance of the resistor 66 is much greater than the threshold voltage $V_T$ of the transistor 60, the transistor 60 cannot be off, so that some current must pass through the transistor 60. However, if the transistor 60 is on to a large extent, it will take enough current to reduce current through the resistor 66, which will drop the voltage across the resistor 66 and tend to turn off the transistor 60. Thus, if the size of the transistor 60 is chosen as large enough (meaning that when that transistor 60 is on, it is capable of sinking a current substantially larger than the actual current flowing through it), then the transistor 60 will bias into a state just on, i.e., so that the voltage across the resistor 66 is substantially equal to the threshold voltage $V_T$ of the transistor 60.

Figure 5:
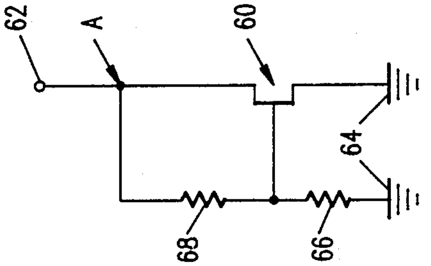
FIG. 5 is a schematic view of a circuit for multiplying the threshold voltage of a field effect transistor.

Referring to FIG. 5, this circuit is a variation of the one shown in FIG. 4, further including a resistor 68 in the connection between the drain of the transistor 60 and the gate of the transistor 60. It will be seen that current through the resistor 68 is the same as the current through the resistor 66, and by choosing a value of resistance of the resistor 68 to be a certain multiple of the value of the resistance of the resistor 66, a multiple of the threshold voltage $V_T$ of the transistor 60 will be generated at the node A. For example, assuming that the value of resistance 68 is three time the value of the resistance of resistor 66, the total voltage drop across those resistors 66, 68 is $4V_T$, which is equal to the voltage at the node A.

Figure 6:
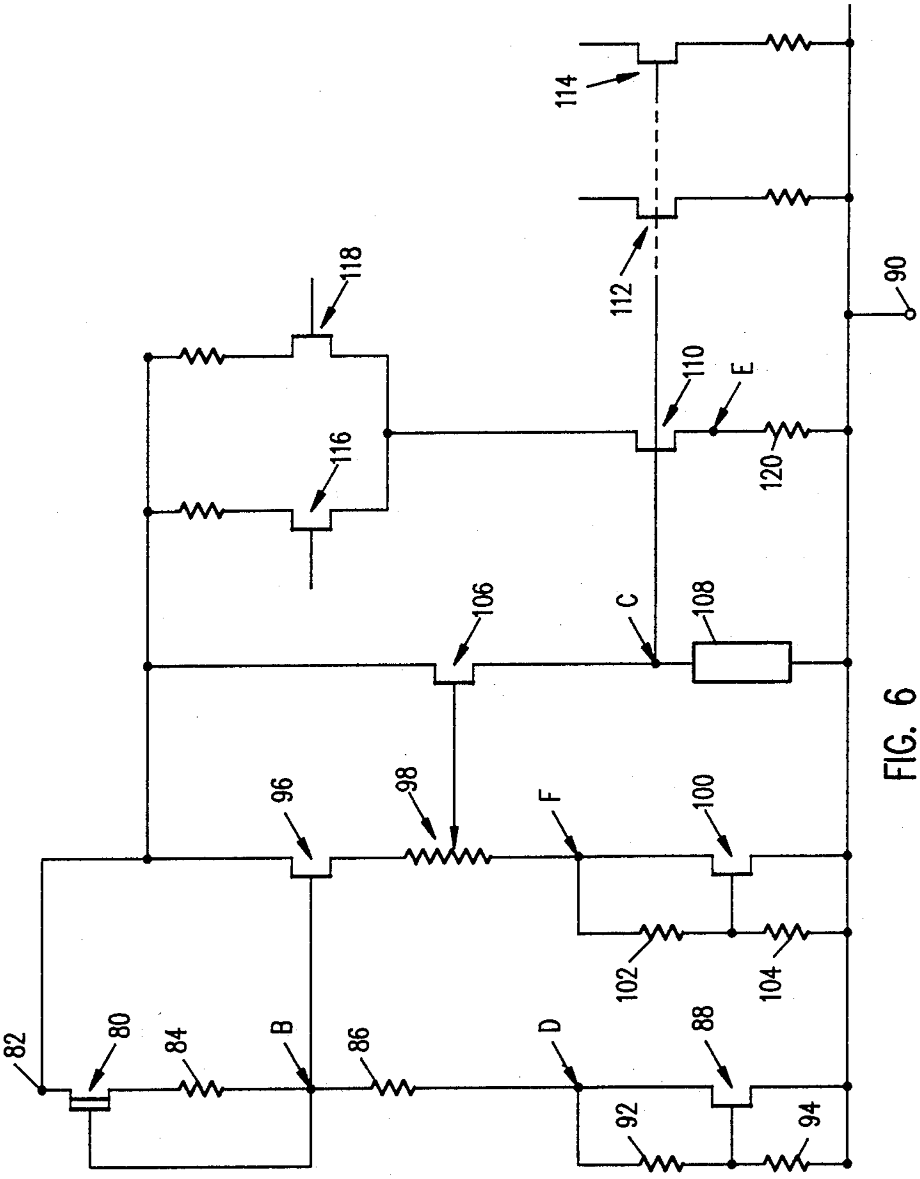
FIG. 6 is a schematic view of a circuit for generating a first substantially constant reference voltage.

FIG. 6 shows an implementation of a circuit incorporating the features thus far described.

As shown therein, this circuit has a depletion mode junction field effect transistor 80 having its drain connected to a first voltage supply terminal 82, and its source connected to a first resistor 84. A second resistor 86 is in series with the first resistor 84, the second resistor 86 in turn connected to the drain of an enhancement mode junction field effect transistor 88, which in turn has its source connected to a second voltage terminal 90 which is a ground terminal. The transistors 80, 88 are then connected in series. The gate of the transistor 80 is connected to its source through the resistor 84 and is also connected to the node B between the resistor 84, 86. The drain of the transistor 88 is connected to its gate through resistor 92, and the gate of that transistor 88 is also connected through a resistor 94 to the ground terminal 90.

Another enhancement mode junction field effect transistor 96 has its gate connected to the node B between the resistors 84, 86 (which node is also between the transistors 80, 88), its drain connected to the first voltage supply terminal 82, and its source connected to a variable resistor 98, which will be described in detail further on. The variable resistor 98 is also connected to the drain of another enhancement mode junction field effect transistor 100, which in turn has its source connected to the ground supply terminal 90. The gate of the transistor 100 is connected to its drain through a resistor 102, and also to the ground supply terminal through a resistor 104. The output value of the variable resistor 98 is applied to the gate of another enhancement mode junction field effect transistor 106, which has its drain connected to the voltage supply terminal 82, and its source connected to the ground supply terminal 90 through a load 108. An output signal is taken at node C from the source of the transistor 106, and is applied to the gates of a series of transistors 110, 112, 114, which are the equivalent of the transistor 38 shown in FIG. 1, operatively coupled with respective differential pairs of transistors 116, 118.

The portion of the circuit including the two transistors 80, 88 acts as a substantially constant reference voltage ($V_{REF1}$) generator, the operation of which will now be described in detail. Assuming, initially, power supplied to the terminal 82, and as an example, that the resistors 84, 86, 92, 94 have values of 5k ohms, 10k ohms, 20k ohms and 20k ohms, respectively, the voltage drop across the resistor 84 is substantially $-V_P$ of the transistor 80, while the voltage drop across the resistor 86 is substantially $-2V_P$ of transistor 80 (because of the differing value of resistors 84, 86 as set forth above plus the fact that the same current passes through both resistors 84, 86). Furthermore, the voltage drop across the resistor 92 is substantially $V_T$ of the transistor 88, while the voltage drop across the resistor 94 is also substantially $V_T$ of the transistor 88. The node B between the resistors 84, 86 is substantially at $$2V_T - 2V_P = 2(V_T - V_P).$$

It is to be remembered at this point that $V_T - V_P$ is substantially constant. The node D is at substantially $2V_T$ of transistor 88. It will therefore be seen that the present circuit generates a substantially constant voltage at the node B equal to $2(V_T - V_P)$.

Assuming that the resistors 84, 86, 92, 94 have the respective values 5k ohms, 10k ohms, 80k ohms and 20k ohms, this places the value of the voltage at node B at $$5V_T \text{(transistor 88)} - 2V_P \text{(transistor 80)}.$$

This voltage is applied to the gate of transistor 96, which provides a voltage drop of one $V_T$ so that the voltage at the source of transistor is $4V_T - 2V_P$. Assuming that the resistors 102, 104 have respective values of 20k ohms and 20k ohms, the node F is at $2V_T$, so that the voltage read off the variable resistor 98 and applied to the gate of transistor 106 will be $$\begin{aligned} V &= K'(V_{top} \text{ resistor 98} - V_{bot} \text{ resistor 98}) + V_{bot} \text{ resistor 98}) \\ &\quad \text{(where } K = 2K'\text{)} \\ &= K'[(4V_T - 2V_P) - 2V_T] + 2V_T = K(V_T - V_P) + 2V_T. \end{aligned}$$

As indicated above, this voltage is applied to the gate of transistor 106, dropping two threshold voltages through transistor 106 and transistor 110 so that the voltage appearing at the node E is $K(V_T - V_P)$ (this being the voltage across the resistor 120), which is exactly that desired.

Figure 7:
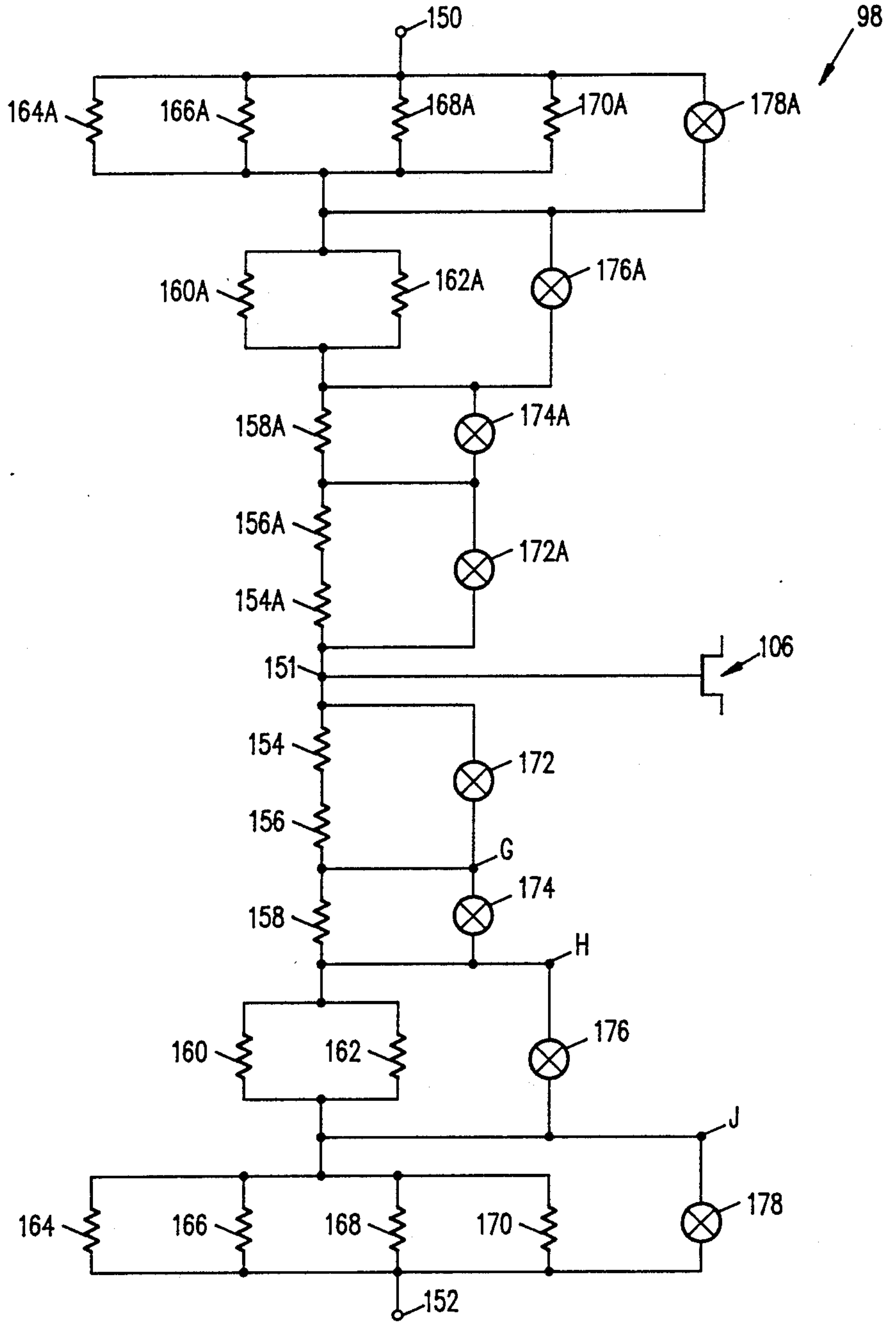
FIG. 7 is a schematic view of the circuit of the variable resistor of FIG. 6.

The implementation of the variable resistor structure 98 is shown in FIG. 7. In the manufacture thereof, each of the resistors shown is fabricated to have substantially the same resistance value, and they are set up so that the overall structure has terminals 150, 151, 152, with output taken from the terminal 151 applied to the gate of transistor 106.

As the layout of the variable resistor structure 98 is symmetrical on both sides of the terminal 151, only that portion of the variable resistor structure 98 below the terminal 151 as seen in FIG. 7 will be described in detail, with corresponding numbers applied to corresponding parts of the structure above the terminal 151.

The resistors 154, 156, 158 are in series, the resistor 158 being connected to a pair of parallel-connected resistors 160, 162, those resistors 160, 162 in parallel in turn connected to four parallel-connected resistors 164, 166, 168, 170, which in turn connect to the terminal 152. A disconnectable link including a laser programmable fuse 172, connects the terminal 150 with the node G between the resistors 156, 158, while a similar disconnectable link including a laser programmable fuse 174 connects the node G with the node H between the resistor 158 and the pair of resistors 160, 162 in parallel. Further on, a disconnectable link in the form of a laser programmable fuse 176 connects the node H with the node J between the pair of resistors 160, 162 in parallel and the four resistors 164, 166, 168, 170 in parallel, and finally, a disconnectable link in the form of a laser programmable fuse 178 connects the node J with the terminal 152. It will be seen that with the value of each resistance substantially the same, considering that the voltage drop across the four parallel resistors 164, 166, 168, 170 is $R_1$, the voltage drop across the two resistors 160, 162 in parallel would be $2R_1$, the voltage drop across the resistor 158 would be $4R_1$, and the voltage drop across the resistors 154, 156 would be $8R_1$. By blowing appropriate fuses, the overall value of the resistance of the structure of FIG. 7 from terminal 150 to terminal 152 can be chosen, and also the voltage signal read at terminal 151 can be chosen, by so choosing the resistances (and voltage drops thereacross).

Figure 8:
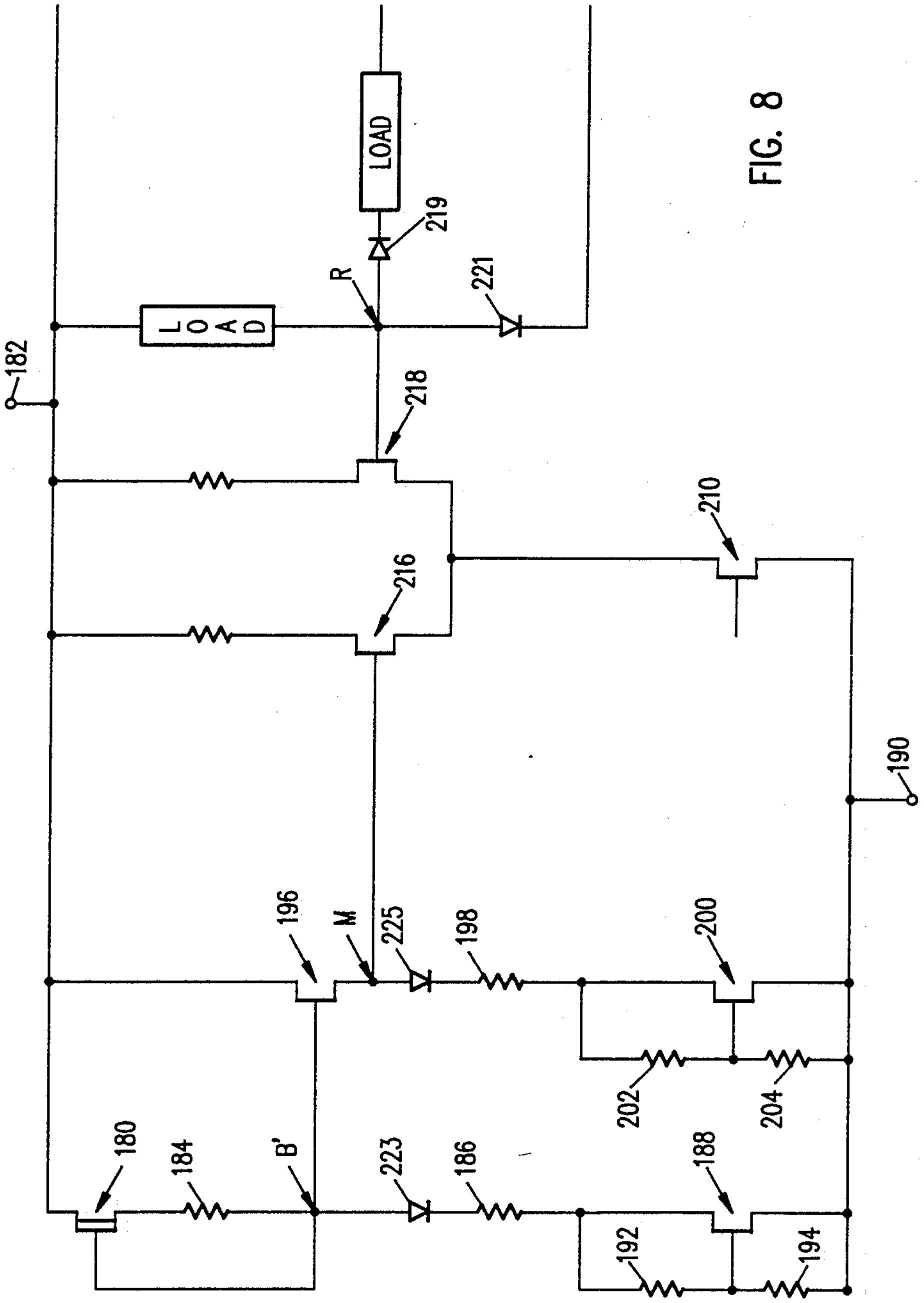
FIG. 8 is a schematic view of a circuit for generating a second substantially constant reference voltage.

A further circuit for generating a substantially constant reference voltage is shown in FIG. 8. This circuit is applicable to the situation where a differential pair of transistors 216, 218 is provided, similar to that previously described, but in this case, the voltage applied to the gate of the transistor 216 is substantially constant ($V_{REF3}$), while the voltage applied to the gate of the transistor 218 is changeable from a value higher than $V_{REF3}$ to a value lower than $V_{REF3}$. In this case, it is desirable that the input signal to the gate of the transistor 216 satisfies TTL input threshold requirements, approximately 1.5 volts.

In furtherance thereof, a signal is applied through a diode 219 reverse biased in the direction of the signal to the gate of the transistor 218. The voltage supply terminal 182 is connected to the gate of the transistor 218 between that gate and the diode 219, and another diode 221 connects the gate of the transistor 218 with an additional substantially constant reference voltage $V_{REF4}$, the generation of which will later be described in detail, that diode 221 also being reverse biased in the direction from the reference voltage $V_{REF4}$ toward the gate of the transistor 218. The remaining structure is similar to that shown in the left-hand portion of FIG. 6; however, with the resistor 198 being fixed in value rather than variable, and with a diode 223 connecting the resistors 184, 186 and forward biased in the direction from the voltage supply terminal 182 to the voltage supply (ground) terminal 190, the gate of transistor 180 being connected to mode B' between the resistor 84 and diode 223, and further including another diode 225 connecting the source of the transistor 196 and the resistor 198, also forward biased in the direction from the voltage supply terminal 182 to the voltage supply terminal 190, with the gate of the transistor 216 being connected to the source of the transistor 196. The resistor 198 connects the diode 225 and drain of transistor 200. In this situation, the transistor 218 will switch from one state to another at approximately 1.5 volts $+\phi$, where $\phi$ is the value of the diode 225 forward drop. Thus, the reference voltage $V_{REF3}$ applied to the gate of transistor 216 is to be set at substantially 1.5 volts$+\phi$.

In the present situation, the practiced process is capable of achieving $2V_T-2V_P=\sim 1.5$ volts. Thus, where the voltage at the node B in the embodiment of FIG. 6 was at $K(V_T-V_P)$, by adding the diode 223, the voltage at the node B' of FIG. 8 will be $\phi+K(V_T-V_P)$. Choosing K to be equal to 2, and the resistors to have the following values:

resistor 184=5K ohm,
resistor 186=10K ohm,
resistor 192=20K ohm,
resistor 194=10K ohm,
resistor 198=10K ohm,
resistor 202=10K ohm,
resistor 204=10K ohm, the voltage across the resistor 184 will be $-V_P$, the voltage drop across the diode 223 will be $\phi$, the voltage drop across the resistor 186 will be $-2V_P$, the voltage across the resistor 192 will be $-2V_T$, and the voltage across the resistor 194 will be $V_T$. The voltage at the node B' will be $3V_T-2V_P-\phi$, so that the reference voltage taken from the source of transistor 196 (node M) will be $2V_T-2V_P+\phi$, i.e., the voltage across the diode 225 is $\phi$, the voltage drop across the resistor 198 is $-2V_P$, and the voltage drop across each of the resistors 202, 204 is $V_T$.

Figure 9:
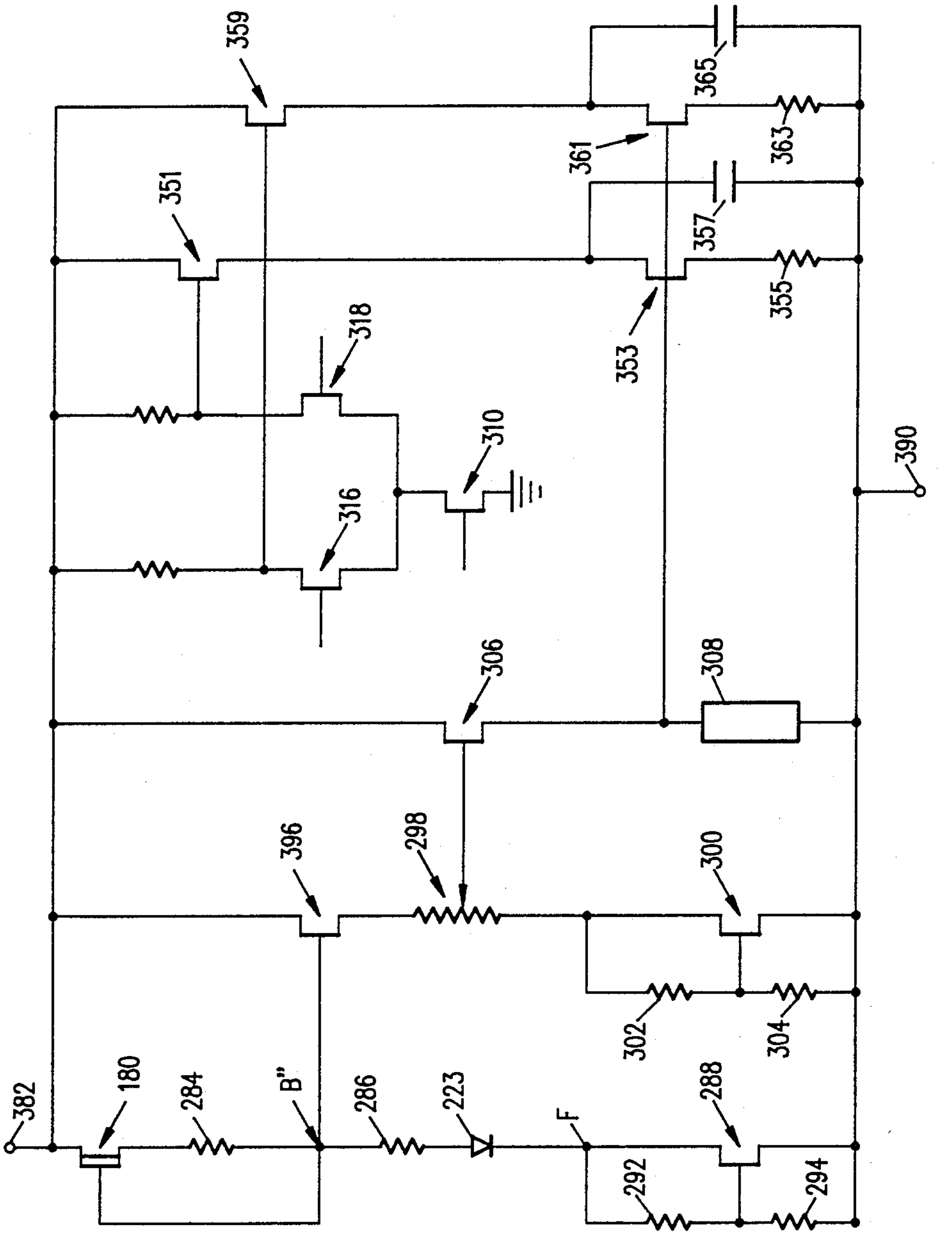
FIG. 9 is a schematic view of a circuit for generating a reference voltage which is applied to generate a substantially constant reference current.

Referring to FIG. 9, the left-hand portion of that circuit is similar to that shown in FIG. 6, but with a diode 223 included between resistor 286 and the drain of transistor 288, forward biased in the direction from the voltage supply terminal 382 to the voltage supply (ground) terminal 390. However, the output taken from the source of transistor 306 is not applied to the transistor 310 connected to the differential pair 316, 318. Rather, the voltage applied to the gate of that transistor 310 is the reference voltage $V_{REF1}$ first described above. This circuit further includes enhancement mode junction field effect transistors 351, 353 connected in series, i.e., the drain of the transistor 351 is connected to the voltage supply terminal 382, and the source thereof is connected to the drain of transistor 353. The source of transistor 353 is in turn connected to a resistor 355 which is in turn connected to the ground supply terminal 390.

Likewise, enhancement mode junction field effect transistors 359, 361 are connected in series, the drain of transistor 359 connecting to the voltage supply terminal 382, and the source of that transistor 359 connecting to the drain of transistor 361. The source of transistor 361 connects through a resistor 363 to the voltage supply terminal 390. The gate of the transistor 351 is connected to the drain of transistor 318, while the gate of the transistor 359 is connected to the drain of transistor 316.

The loads in the form of the capacitors 357, 365 are substantially constant over temperature variations and variations in the process in fabricating the device.

As is known, $I=C\ dV/dt$. In order to achieve a constant current, $I/C=dV/dt$ so that $dV/dt$ is substantially a constant.

In order to achieve a constant current through resistors 355, 363, choosing them of the same values, and choosing the capacitors 357, 365 of the same values, knowing that the value of each such resistor varies with temperature, it would be desirable for the value of the voltage across each resistor 357, 363 to track with variations in the value of that resistor ($I=V/R$).

As it is known that in gallium arsenide technology the resistance value of resistors increases with increasing temperature, the sum of $\phi-KV_P$ can be varied by choosing the desired K value, to also increase with temperature at the sam rate as the value of the resistors.

In furtherance thereof, the voltage across the resistor 284 will be $-V_P$, while the voltage across the resistor 286 will be $-KV_P$, the voltage across the the diode will be $\phi$, and the voltage across the transistor 288 will be $NV_T$ (assuming multiplication of $V_T$ as previously described). Assuming values of resistances of resistors 284, 286, 292, 294 chosen appropriately, the node B'' is at the voltage level of $-KV_P+\phi+3V_T$, the voltage across the resistor 286 is $-3V_P$, and the voltage at the node F is $3V_T$. The voltage at the top of the variable resistor 298 will be $2V_T-3V_P+\phi$, while the voltage at the bottom of the variable resistor 298 will be $2V_T$.

The voltage taken off the variable resistor will be at $K(V_{top}-V_{bot})+V_{bot}=K(-3V_P+\phi)+2V_T$, so that the voltage across the resistor 355 (or 367) is $K(-3V_P+\phi)$. It will thus be seen that the voltage drop across resistor 355 (or 367) has been chosen to meet the desired limitations above, i.e., the sum $\phi-KV_P$ increases and decreases with temperature at substantially the same rate as the resistor values.

Figure 10:
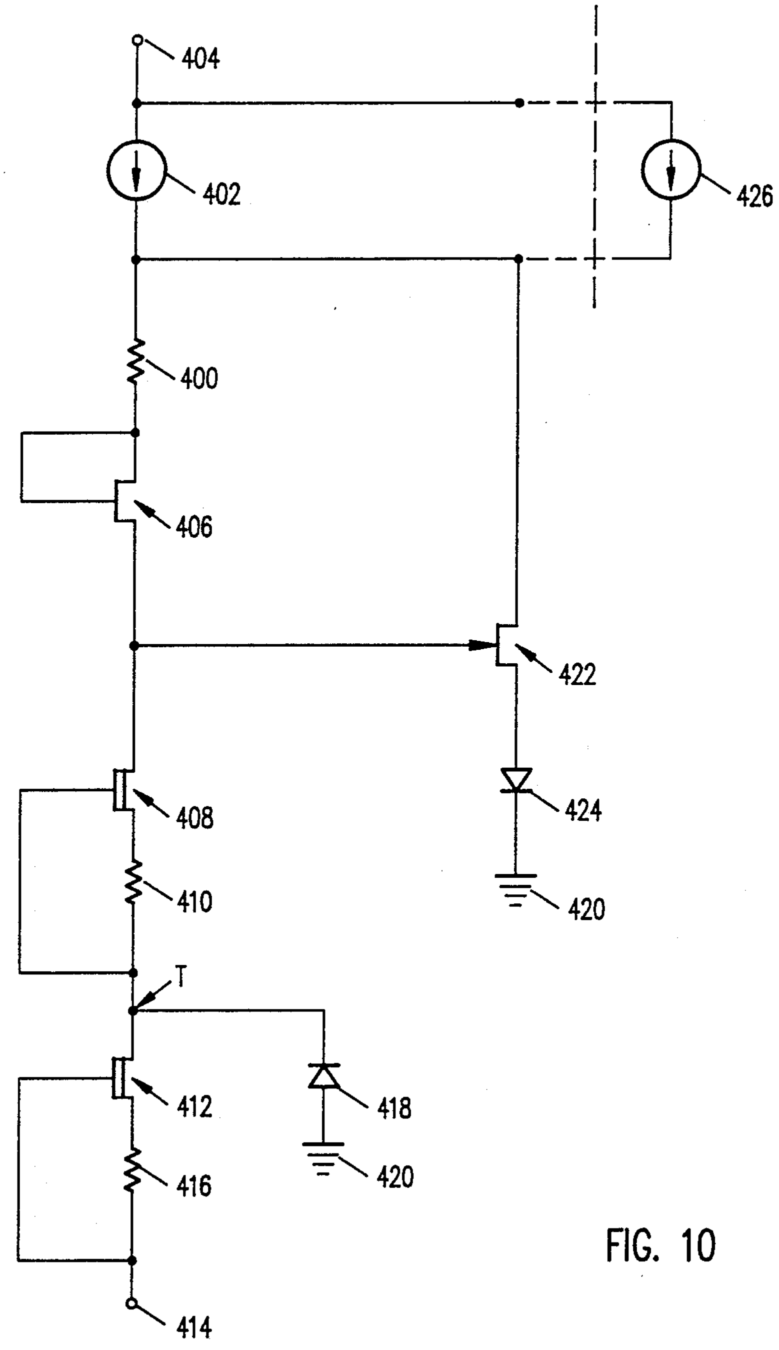
FIG. 10 is a schematic view of a circuit for generating a third substantially constant reference voltage.

Finally, referring to FIG. 10, the circuit for generating the substantially constant reference voltage $V_{REF4}$ is shown.

As previously described, the reference voltage applied to the transistor 216 of the differential pair 216, 218 (FIG. 8) is $2V_T-2V_P+\phi=1.5$ volts$+\phi$. It is desired that the reference voltage $V_{REF4}$ applied to reverse biased diode 221 be substantially equal to the reference voltage $V_{REF3}$ so that the node R is clamped at a voltage equal to $\phi$higher than the reference voltage $V_{REF3}$. Furthermore, it may be desirable to tie a large number of stages (for example, as many as eleven stages) to the reference voltage $V_{REF4}$ so that the means generating this reference voltage $V_{REF4}$ will have to sink from zero to eleven times the current through each stage.

Such a circuit is shown in FIG. 10. As shown therein, a resistor 400 is connected to a bias current source 402 which is in turn connected to the voltage supply terminal 404. The resistor 400 also connects to the drain of an enhancement mode junction field effect transistor 406, which has its drain connected to its gate. The source of that transistor 406 is connected to the drain of a depletion mode junction field effect transistor 408. the source of which is connected to a resistor 410. That resistor connects to the drain of a depletion mode junction field effect transistor 412 which has its source connected to a voltage supply terminal 414 through a resistor 416. The gate of the transistor 408 is connected to the drain of transistor 412, while the gate of the transistor 412 is connected to the voltage supply terminal 414. A diode 418 is connected between the drain of transistor 412 and a voltage supply terminal 420 which is a ground voltage supply terminal, the diode 418 being reverse biased in a direction from the voltage supply terminal 404 to the voltage supply terminal 420.

Further included is an enhancement mode junction field effect transistor 422 having its gate connected to the source of transistor 406 and drain of transistor 408, and its source connected to a diode 424 which is in turn connected to the voltage supply terminal 420, this diode 424 being forward biased in the direction from the voltage supply terminal 404 to the voltage supply terminal 420. The drain of transistor 422 is also connected to the voltage supply terminal 404 through the current bias source 402.

The current through the current source 426 (which acts as a load for the circuit thus far described) may vary from 0 (zero) I to 11 (eleven) I, as previously described. Because of the inclusion of the current bias source 402, the current through the transistor 422 will vary from 11I to 22I, so that a two-to-one variation is achieved rather than eleven to approximately zero.

In the circuit of FIG. 10, upon proper choosing of resistor values as previously described (value of resistor 400=2× value of resistor 410), the voltage drop across the resistor 400 is $-2V_P$ for transistor 408, (noting that $V_P$ is negative), the voltage drop across the transistor 406 is approximately $V_T$, and the voltage drop across the resistor 410 is $-V_P$. The voltage drop across the gate-to-source junction of the transistor 422 is approximately $V_T$, while the voltage drop across the diode 424 is $\phi$. The transistor 422 is provided as a large device, so that it only needs to turn on slightly more than $V_T$ to sink up to 22I. Therefore, the voltage $V_{REF4}$ supplied to diode 221 of FIG. 8 (see above) and taken from the drain of transistor 422=$\phi$ diode 424+$V_T$ transistor 422 +$V_T$ transistor 406 $V_p$ of transistor 408. It can be seen that if voltage $V_{REF4}$ were lower than that value, transistor 422 would shut off and current source 402 (or 426) would then pull $V_{REF4}$ back up to correct value in a compensating action If the voltage at $V_{REF4}$ were to be above the correct value, then transistor 422 would turn on more and pull $V_{REF4}$ back down to the correct value. This is true because the voltage $\phi$ (diode 424), $V_T$ (transistor 406) and V (resistor 400) are constrained by the circuit to be substantially constant so that any change in $V_{REF4}$ results in a corresponding change in $V_{GS}$ transistor 422 causing transistor 422 to counteract the original change (negative feedback). The node T remains at approximately $\phi$ below ground because the sinking current through transistor 412 and resistor 416 is chosen always to be substantially greater than the reference current which flows through transistor 408 and resistor 410. Therefore, some of the sinking current is always available to flow through diode 418 thereby generating a diode drop thereacross. The sinking current passes through diode 418, transistor 412, and resistor 416 from ground to the second voltage supply terminal 414. It will be seen that even with the load current through the transistor 422 varying, the reference current directed through the resistor 400, transistor 406, transistor 408 and resistor 416 will remain substantially constant even with great variations in overall sink current of the device. In fact, the reference current is dependent only upon $V_p$ of transistor 408 and resistor value of resistor 410 and equals $$\frac{-V_p \text{ of transistor 408}}{\text{value of resistor 410}}$$

It will readily be seen that the various embodiments of the circuitry are capable of generating various substantially constant reference voltages and/or currents, as is appropriate, depending on the particular environment of the circuit. Each of the embodiments herein is readily implementable in compound semiconductor technology, including with specific advantage gallium arsenide technology, wherein generation of such substantially constant reference voltages or current has proven particularly problematical.

I claim:

1. Apparatus for generating a substantially constant reference voltage while sinking varying current comprising:
   - a first voltage supply terminal;
   - a second voltage supply terminal;
   - a first current source connected to the first voltage supply terminal;
   - a load, the first current source connecting the first voltage supply terminal and load;
   - a second current source connected to the second voltage supply terminal and the the first current source through the load, said current of said second current source being substantially independent of changes in voltages thereacross; and
   - a field effect transistor having a first current handling terminal connected between the first current source and load, a second current handling terminal connected to the second voltage supply terminal, and a current control terminal connected between the load and second current source.

2. Apparatus for generating a substantially constant reference voltage while sinking varying current comprising:

a first voltage supply terminal;

a second voltage supply terminal;

a first current source connected to the first voltage supply terminal;

a load, the first current source connecting the first voltage supply terminal and load;

a second current source connected to the second voltage supply terminal and to the first current source through the load; and a field effect transistor having a first current handling terminal connected between the first current source and load, a second current handling terminal connected to the second voltage supply terminal, and a current control terminal connected between the load and second current source, wherein the second current source comprises a second depletion mode field effect transistor having a first current handling terminal connected to the load, a second current handling terminal, a current control terminal connected to the second voltage supply terminal, and a resistor connecting the second current handling terminal of the second transistor and the second voltage supply terminal.

3. Apparatus for generating a substantially constant reference voltage while sinking varying current comprising:

a first voltage supply terminal;

a second voltage supply terminal;

a first current source connected to the first voltage supply terminal;

a load, the first current source connecting the first voltage supply terminal and load;

a second current source connected to the second current voltage supply terminal and to the first current source through the load, said current of said second current source being substantially independent of changes in voltage thereacross; and a field effect transistor having a first current handling terminal connected between the first current source and load, a second current handling terminal connected to the second voltage supply terminal, and a current control terminal connected between the load and second current source, and further comprising an additional field effect transistor providing the connection between the load and second current source and having a first current handling terminal connected to the load, a second current handling terminal connected to the second current source and the current control terminal of the first-mentioned field effect transistor, and a current control connected to the first current handling terminal of the additional transistor.

4. The apparatus of claim 1 wherein the load comprises a resistor.

5. Apparatus for generating a substantially constant reference voltage while sinking varying current comprising:

a first voltage supply terminal;

a second voltage supply terminal;

a first current source connected to the first voltage supply terminal;

a load, the first current source connecting the first voltage supply terminal and load;

a second current source connected to the second voltage supply terminal and to the first current source through the load;

a field effect transistor having a first current handling terminal connected between the first current source and load, a second current handling terminal connected to the second voltage supply terminal, and a current control terminal connected between the load and second current source, and further comprising a diode connecting the second current handling terminal of the transistor and the second voltage supply terminal and forward biased in the direction from the first voltage supply terminal toward the second voltage supply terminal.

6. Apparatus for generating a substantially constant reference voltage while sinking varying current, comprising:

a first voltage supply terminal;

a second voltage supply terminal;

a third voltage supply terminal;

a first current source connected to the first voltage supply terminal;

a first load, the first current source connecting the first voltage supply terminal and first load;

a second current source, the first load connecting the first current source and second current source;

a second load connected between the second current source and the third voltage supply terminal;

the first voltage supply terminal, first current source, first load, second current source, second load and third voltage supply terminal being connected in series;

a diode connected to the second voltage supply terminal and between the second current source and second load, and reverse biased in a direction from the first voltage supply terminal toward the second voltage supply terminal; and a transistor having a first current handling terminal connected between the first load and first current source, a second current handling terminal connected to the second voltage supply terminal, and a current control terminal connected between the first load and second current source.

7. The apparatus of claim 6 wherein the second current source comprises a second, depletion mode field effect transistor having a first current handling terminal connected to the first load, a second current handling terminal, a current control terminal connected to the connection of the diode and second load, and a resistor connecting the second current handling terminal of the second transistor and the current control terminal of the second transistor.

8. The apparatus of claim 6 and further comprising and additional field effect transistor providing the connection between the first load and second current source and having a first current handling terminal connected to the first load, a second current handling terminal connected to the second current source and the current control terminal of the first-mentioned transistor, and a current control terminal connected to the first current handling terminal of the additional transistor.

9. The apparatus of claim 6 wherein the first load comprises a resistor.

10. The apparatus of claim 6 and further comprising a diode connecting the second current handling terminal of the transistor and the second voltage supply terminal and forward biased in the direction from the first voltage supply terminal toward the second voltage supply terminal.

* * * * *

UNITED STATES PATENT AND TRADEMARK OFFICE
CERTIFICATE OF CORRECTION

PATENT NO. : 4,868,416

DATED : Sep. 19, 1989

INVENTOR(S) : Mark E. Fitzpatrick and Gary R. Gouldsberry

It is certified that error appears in the above-identified patent and that said Letters Patent is hereby corrected as shown below:

In the Abstract, line 6, change "currect" to --current--.

Col. 2, line 63, after "source" insert a period.

Col. 3, line 9, change "voltage" to --voltages--.

Col. 3, line 24, "FIG. 7 is" should be a new paragraph.

Col. 7, line 65, change "$3V_T-2V_p-\emptyset$, so" to --$3V_T-2V_p+\emptyset$, so--.

Col. 8, line 48, change "sam" to --same--.

Col. 9, line 68, change "406 $V_p$" to --406 $-2V_p$--.

Col. 10, line 4, after "action" insert a period.

Col. 10, line 15, change "always to be" to --to always be--.

Signed and Sealed this

Twentieth Day of November, 1990

*Attest:*

HARRY F. MANBECK, JR.

*Attesting Officer* *Commissioner of Patents and Trademarks*